United States Patent [19]
Reid

[11] 4,359,745
[45] Nov. 16, 1982

[54] CATHODE RAY TUBE DISPLAY APPARATUS

[75] Inventor: Dean F. Reid, Englewood, Colo.

[73] Assignee: Honeywell Inc., Minneapolis, Minn.

[21] Appl. No.: 173,854

[22] Filed: Jul. 30, 1980

[51] Int. Cl.³ ............................................. G01D 9/00
[52] U.S. Cl. ................................. 346/23; 346/110 R
[58] Field of Search ............. 346/110 R, 23, 110 V; 315/379, 391, 392, 395; 178/30, 15; 340/724, 728; 358/220

[56] References Cited

U.S. PATENT DOCUMENTS

| | | | |
|---|---|---|---|
| 3,333,237 | 7/1967 | Chapman | 346/110 R |
| 3,348,229 | 10/1967 | Freas | 346/110 R |
| 3,698,004 | 10/1972 | Lone | 346/23 |
| 3,700,955 | 10/1972 | Lowe | 346/110 R X |

Primary Examiner—G. Z. Rubinson
Assistant Examiner—W. J. Brady
Attorney, Agent, or Firm—Charles J. Ungemach

[57] ABSTRACT

There has been provided, in accordance with the present invention, a cathode ray tube recording system which includes means for superimposing grid lines on the resulting record. The grid lines so-recorded for each complete record are not shifted. At the beginning of each new record, however, a randomly selected bias is applied to the grid line positioning circuit whereby the grid lines are started on a fresh phosphor position for each subsequent recording but selected on a random basis.

5 Claims, 3 Drawing Figures

CATHODE RAY TUBE DISPLAY APPARATUS

CROSS REFERENCES

Cross-reference is made to U.S. Pat. No. 3,700,955 issued to Peter R. Lowe on Oct. 24, 1972 entitled "Cathode Ray Tube Apparatus With Extended Tube Life".

BACKGROUND OF THE INVENTION

The present invention relates to recording and display apparatus. More particularly, it relates to improvements relating to line scan cathode ray tube recording apparatus.

It is known that in cathode ray tube devices, the phosphor coating on the inner surface of the tube face has the disadvantage that when it is driven hard, the phosphor exhibits a limited phosphor life. That is, after a determined length of time, the phosphor no longer responds to the electron beam stimulus to create an effective light image. The effective life of the phosphor is an inverse function of how hard the phosphor is driven. In cathode ray tube recording devices, the phosphor is excited with a high intensity electron beam in order to gain a high order of light emission whereby to effect a reasonable record. In the so-called line scan type recording tube, the electron beam is deflected substantially only in the X-direction. This causes the beam to traverse repeatedly over a very narrow area on the phosphor surface. It has been heretofore recognized that such traversing of a single small line across the face of the phosphor coating soon causes the phosphor to become ineffective. To alleviate this aspect of the problem, there has been disclosed in the above-identified U.S. Pat. No. 3,700,955, a technique for imparting a slight vertical shift to the scanning cathode ray beam between predetermined limits and at a relatively slow rate, to cause the beam to traverse across differing lines on the face of the CRT but still within a reasonable range to avoid distorting the value of the record.

In utilizing such apparatus in making analog records of variable signals, there has been superimposed upon the analog data periodic pulses of the cathode ray beam to cause the appearance of grid lines on the resultant chart. These grid lines are formed by periodically pulsing the unblanking circuit for the CRT at the same transverse spots for each successive scan of the scanning cathode ray beam. The repeated excitation of the same portions of the phosphor needed to generate such grid lines causes an early deterioration of the phosphor at those spots. In an effort to distribute the wear on those spots over a wider area, there has been provided in the past, a slow ramp bias to cause the grid lines to slowly drift from a fixed starting position. For example, during the course of the running of a full roll of chart paper, the grid lines would drift from a starting position to an end position approximately one-eighth of an inch to the right. While such a change is very slight it still introduces a measure of distortion in the resulting record.

SUMMARY OF THE INVENTION

It is, accordingly, an object of the present invention to provide an improved CRT recording apparatus.

It is still another object of the present invention to provide improved means for extending the life of a phosphor in a CRT recording apparatus.

In accomplishing these and other objects, there has been provided, in accordance with the present invention, a cathode ray tube recording system which includes means for superimposing grid lines on the resulting record. The grid lines so-recorded for each complete record are not shifted. At the beginning of each new record, however, a randomly selected bias is applied to the grid line positioning circuit whereby the grid lines are started on a fresh phosphor position for each subsequent recording but selected on a random basis.

BRIEF DESCRIPTION OF THE DRAWINGS

A better understanding of the present invention may be had from the following detailed description when read in the light of the accompanying drawings, in which.

DETAILED DESCRIPTION

Figure 1:
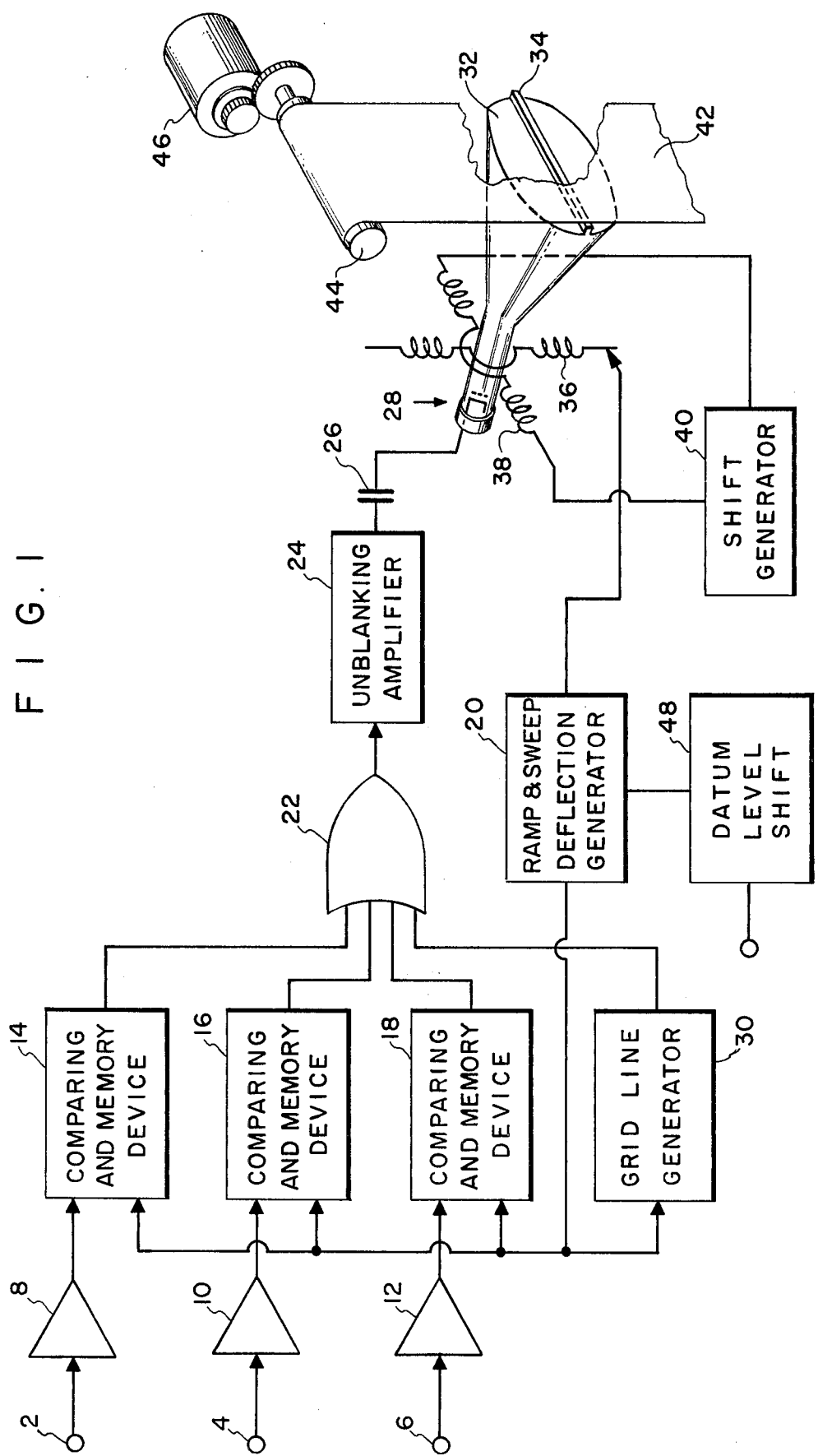
FIG. 1 is a schematic block diagram of a cathode ray tube recording system embodying the present invention.

Referring now to the drawings in more detail, there is illustrated in FIG. 1 a cathode ray tube recording system which is basically similar to the recording system illustrated in U.S. Pat. No. 3,700,955. The system is adapted to accept a plurality of input signals represented by the three input terminals 2, 4 and 6. These input terminals are connected, respectively, to the input of three buffer amplifiers 8, 10 and 12. The output of the several buffer amplifiers are connected respectively to an input of comparing and memory devices 14, 16 and 18. A second input to the comparing memory devices is derived from a ramp and sweep deflection generator 10. The output signals from the comparing and memory devices 14, 16 and 18 are connected to corresponding input terminals of an OR gate 22, the output of which is connected to the input of an unblanking amplifier 24. The output of the unblanking amplifier is connected through a DC block capacitor 26 to the Z-axis control electrode of a CRT device 28.

A grid line generator 30 has an output connected to a fourth input terminal of the OR gate 22. The grid line generator also has a reference input connected to the ramp and sweep deflection generator 20. The grid line generator produces a series of spaced pulses which when transmitted through the OR gate 22 to the unblanking amplifier 24 causes the sweeping cathode ray beam of the cathode ray tube 28 to be energized whereby to produce the desired grid lines.

The CRT 28 is provided with a relatively wide flat tube face 32. The tube face 32 has embedded therein a narrow band of fiber optic element 34 extending across the face thereof. The illuminating phosphor, not shown, is applied to the inner surface of the face plate covering at least the inboard ends of the fiber optic elements. A first pair of deflection coils 36 are positioned on the neck of the CRT to effect a deflection of the cathode ray beam in the tube 28 along the X-axis, that is, back and forth along the length of the fiber optics 34. The ramp and sweep deflection generator 20 is connected to the coils 36 to energize those coils, thereby to effect the deflection of the cathode ray beam. A second pair of deflection coils 38 is positioned on the neck of the CRT 28 to provide a measure of deflection of the cathode ray beam along a Y-axis direction. As was previously mentioned herein, the scanning beam is caused to be shifted in the Y-direction through small amounts and very slowly during the course of the recording, in order to distribute the impingement of the cathode ray beam over the surface of the phosphor applied to the inboard ends of the fiber optics elements 34. To effect such a movement of the cathode ray beam in the Y-direction a shift generator 40 is connected to the coils 38, as shown and claimed in the aforementioned U.S. Pat. No. 3,700,955.

A record member 42 is provided for recording the signals from the CRT. It is drawn past the recording face of the CRT 28 by a drive roller 44 under the control of a driving motor 46. The record member 42 is photosensitive and responds to Z-axis modulation of the cathode ray beam in accordance with the signals applied through the OR gate 22 and the unblanking amplifier 24 from the input signal conditioning circuits and/or grid line generator 30.

As previously noted, if the grid line generator always triggers the unblanking amplifier at the same spots on the face of the CRT, the phosphor at those spots would soon be exhausted. In order to avoid the over activity of the phosphor in those spots, a datum level shift circuit 48 is connected to the ramp and sweep deflection of the generator 20. It has been found that if the grid lines are allowed or caused to move gradually and continually over a very relatively small deflection during the course of the recording, a measure of distortion is introduced into the relationship of the grid lines and the data to be recorded. Accordingly, the datum level shift circuit 48 is arranged to shift the datum level for each recording period and to maintain that measure of shift constant during that recording period but to randomly shift that position at the beginning of each recording period. To that end, the datum level shift circuit 48 provides a randomly selected bias signal at the beginning of each recording period whereby to shift the relative position of the sweep signal ramp generated by the generator 20.

Figure 2:
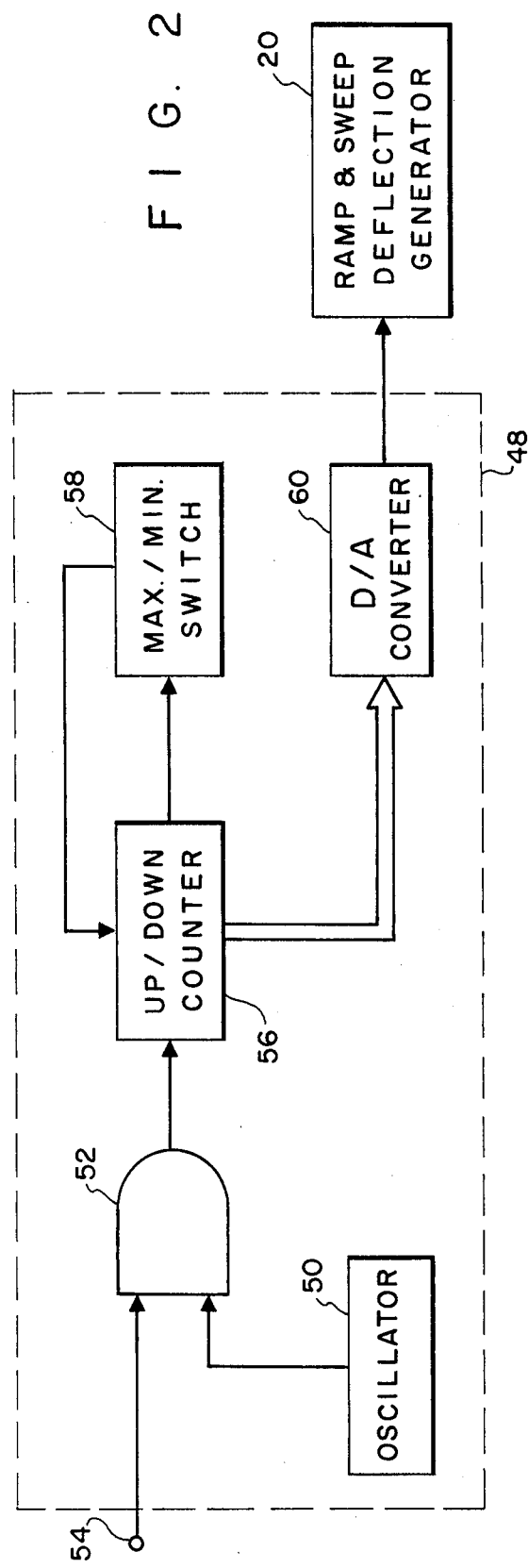
FIG. 2 is a schematic block diagram of circuit means comprising a portion of the system shown in FIG. 1 and embodying the present invention.

In FIG. 2 there is shown a preferred embodiment of a circuit for effecting the datum level shift. The circuit includes a free running, high frequency oscillator 50 which has an output connected to one input terminal of an AND gate 52. A second input terminal of the AND gate 52 is connected to a control signal input terminal 54. The input terminal 54 is connected to circuitry related to the starting of a recording period. The output of the gate 52 is connected to an input terminal of an up/down counter 56. In apparatus constructed in accordance with the present invention, the up/down counter 56 was a pair of integrated circuit modules identified as SN191 manufactured by Texas Instruments Incorporated. The up/down counters of this type have an output terminal which produces a signal whenever a minimum or maximum count has been reached. That terminal is connected, in the circuit shown in FIG. 2, to a max./min. switch 58. Again, in the exemplary embodiment, that switch was in the form of a circuit component identified as an LS112 also manufactured by Texas Instruments. Whenever a maximum count or a minimum count has been achieved in the counter 56 the signal from the min./max. output terminal keys the switch 58 which, in turn, is connected to the up/down input selector terminal of the up/down counter 56. With a logical high signal at the input terminal 54 and the oscillator 50 running free, the counter 56 will continuously count up and down between a minimum and a maximum value. In the exemplary embodiment, a counter comprises an eight bit counter having a minimum value of zero and a maximum value of 255 appearing in digital form at the count output terminals thereof. That digital count is connected to the input of a digital-to-analog converter 16. The output of which is connected to the input of the ramp and sweep deflection generator 20 as a bias signal thereto.

Figure 3:
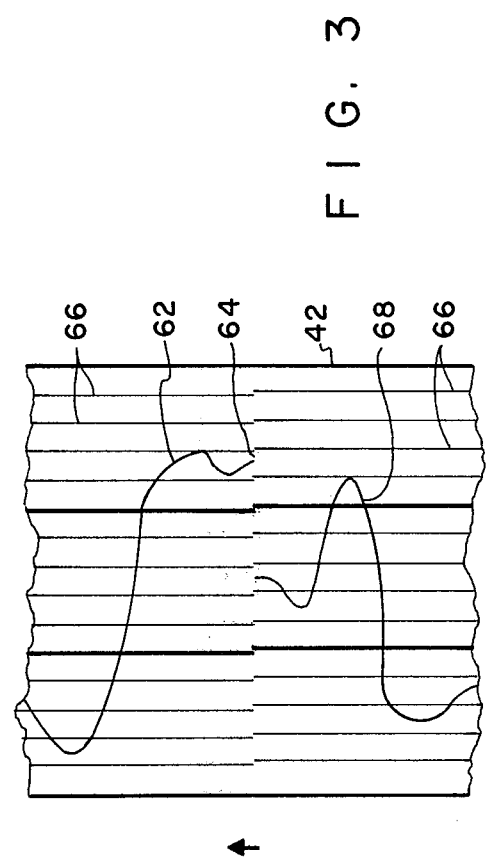
FIG. 3 is an illustration of a portion of a recorded chart in accordance with the present invention.

With the oscillator free running and the control signal at the input terminal at a logical high, the gate 52 is open and the counter 56 continues to count up and down, reversing the count on each maximum and minimum value. When the recording apparatus is conditioned to start the recording, the signal at the input terminal 54 becomes a logical low, blocking the gate 52 and stopping the count at some random value. That value is converted by the D to A converter 60 to a corresponding voltage level signal. When that voltage level signal is applied to the bias input of the ramp and sweep deflection generator 20, it changes the starting point of the ramp signal relative to the edge of the active surface of the CRT 28. One way of accomplishing this is to change the slope of the flyback portion of the ramp signal generated by the generator 20. That shift in the flyback time of the ramp signal may cause a resulting shift in the relative positioning of the grid line dots relative to the face of the CRT. The maximum extent of that shift may be on the order of one-eighth of an inch, however, for any one recording period, that position remains constant. That relationship is illustrated in FIG. 3 wherein there is shown a portion of a record member 42 having a single trace data signal 62 thereon, with the end of that particular recording period appearing at the terminus of the line 62 illustrated at the point 64. The grid lines 66 associated with the record trace 62 are constant in their position relative to the edge of the chart. At the beginning of a new record represented by the trace 68, it may be seen that the grid lines 66 associated therewith have been shifted slightly to the right. That shift was a result of the random counter 56 counting to a number which was different from the number at the beginning of the previous record trace. This provides a means of establishing the grid lines on a record chart which do not introduce distortion relative to the data trace during a particular recording but yet provides a means for distributing the position of those grid lines relative to the face of the CRT during the course of the life of the CRT.

Thus, there has been provided, in accordance with the present invention, improved means for extending the life of the phosphor in a CRT by shifting the position of the grid lines without introducing the heretofore accompanying distortion.

The embodiments of the invention in which an exclusive property or privilege is claimed are defined as follows:

1. A cathode ray tube recording system wherein a cathode ray tube has a face plate and a narrow band of active recording area on said face plate with a correspondingly narrow band of phosphor on the inner surface of said face plate across which a cathode ray beam is caused to sweep, said system, in combination with said tube, comprising:

signal receiving and conditioning means connected to receive signals for recording and to produce corresponding control signals, control means connected to be responsive to said control signals for controlling intensity modulations of said cathode ray beam in accordance with said control signals, to produce data trace signals at said tube face plate;

grid line signal generating means for generating periodic grid line signals, said grid line signal generating means being also connected to control means to superimpose grid line traces on said data traces at said tube face plate;

a ramp signal generating means connected to said tube to cause said cathode ray beam to periodically sweep across said tube face plate; and a random bias signal generating means connected to said ramp signal generating means for applying a randomly selected bias signal to said ramp signal generator to shift the timing of resultant ramp signals relative to said tube face plate.

2. A cathode ray tube recording system as set forth in claim 1 wherein said random bias signal generating means comprises:

an up/down counter means for continuously counting between a maximum and a minimum value;

means for selectively stopping said counter at a random count value; and converting means connected to said counter means to convert said random count value to a random bias signal.

3. A cathode ray tube recording system as set forth in claim 2 wherein said random count value is a digital value and wherein said converting means is a digital-to-analog converter.

4. A cathode ray tube recording system as set forth in claim 3 and including switch means connected to be responsive to said maximum and minimum values in said counter means and connected to said counter means to reverse the direction of the counting thereof.

5. A cathode ray tube recording system as set forth in claim 2 wherein said means for selectively stopping said counter includes a gating means responsive to a gating control signal for selectively gating an enabling signal to said counter means.

* * * * *